(12) United States Patent
Lozhkin

(10) Patent No.: US 8,306,487 B2
(45) Date of Patent: Nov. 6, 2012

(54) PHASE CORRECTOR AND PHASE CORRECTION METHOD

(75) Inventor: Alexander N. Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 386 days.

(21) Appl. No.: 12/813,806

(22) Filed: Jun. 11, 2010

(65) Prior Publication Data
US 2010/0323638 A1 Dec. 23, 2010

(30) Foreign Application Priority Data
Jun. 17, 2009 (JP) ................................. 2009-144325

(51) Int. Cl.
H04B 1/04 (2006.01)
H04L 25/49 (2006.01)

(52) U.S. Cl. .................. 455/114.3; 455/126; 455/67.13; 375/296

(58) Field of Classification Search ............... 455/114.3, 455/126, 115.1, 67.13, 67.16; 375/296
See application file for complete search history.

(56) References Cited

U.S. PATENT DOCUMENTS

| | | | | |
|---|---|---|---|---|
| 5,396,190 A * | 3/1995 | Murata | ......................... | 330/149 |
| 5,699,383 A * | 12/1997 | Ichiyoshi | ....................... | 375/297 |
| 5,900,778 A * | 5/1999 | Stonick et al. | ................ | 330/149 |
| 6,081,698 A * | 6/2000 | Moriyama et al. | ............. | 455/126 |
| 6,418,173 B1 * | 7/2002 | Matsuoka et al. | ............ | 375/297 |
| 6,587,514 B1 * | 7/2003 | Wright et al. | ................. | 375/296 |
| 6,980,604 B2 * | 12/2005 | Kubo et al. | .................... | 375/296 |
| 7,020,447 B2 * | 3/2006 | Nagatani et al. | ........... | 455/114.3 |
| 7,177,366 B1 * | 2/2007 | Dawson et al. | ................ | 375/295 |
| 7,382,834 B2 * | 6/2008 | Dawson et al. | ................ | 375/296 |
| 7,433,420 B1 * | 10/2008 | Dakshinamurthy et al. | .. | 375/296 |
| 7,961,812 B2 * | 6/2011 | Jensen et al. | ................... | 375/297 |
| 8,175,551 B2 * | 5/2012 | Akaiwa | ....................... | 455/114.3 |

OTHER PUBLICATIONS

Joel L. Dawson, et al. "Automatic Phase Alignment for a Fully Integrated CMOS Cartesian Feedback Power Amplifier System" IEEE International Solid-State Circuits Conference, Jan. 2, 2003.
Joel L. Dawson, et al. "Automatic Phase Alignment for a Fully Integrated Cartesian Feedback Power Amplifier System" IEEE Journal of Solid-State Circuits, vol. 38, No. 12, Dec. 2003.

* cited by examiner

Primary Examiner — Duc M Nguyen
(74) Attorney, Agent, or Firm — Katten Muchin Rosenman LLP

(57) ABSTRACT

A phase corrector in a radio transmitter includes a quadrature modulator which modulates a first carrier signal by using an in-phase component and a quadrature component of a first signal, a quadrature demodulator which demodulates a feedback signal by using a second carrier signal to generate a second signal including an in-phase component and a quadrature component, a phase detector which detects a phase error between the first signal and the second signal based on the in-phase components and the quadrature components of the first signal and the second signal, and a phase shifter which performs phase shift of any one of the first signal, the second signal, the first carrier signal and the second carrier signal based on a sum value obtained by adding to the phase error a first phase amount varying on a time base in a given phase range.

10 Claims, 8 Drawing Sheets

FIG. 5

| SIGN OF Q* | SIGN OF I | SIGN OF I* | SIGN OF Q | SIGN OF sin(Δφ) |
|---|---|---|---|---|
| − | − | − | − | UNDEFINED |
| − | − | − | + | + |
| − | − | + | − | + |
| − | − | + | + | UNDEFINED |
| − | + | − | − | − |
| − | + | − | + | UNDEFINED |
| − | + | + | − | UNDEFINED |
| − | + | + | + | − |
| + | − | − | − | − |
| + | − | − | + | UNDEFINED |
| + | − | + | − | UNDEFINED |
| + | − | + | + | − |
| + | + | − | − | UNDEFINED |
| + | + | − | + | + |
| + | + | + | − | + |
| + | + | + | + | UNDEFINED |

FIG. 7

| OUTPUT OF COMPARATOR 51-1 | OUTPUT OF COMPARATOR 51-2 | OUTPUT OF COMPARATOR 51-3 | OUTPUT OF COMPARATOR 51-4 | SIGN OF sin(Δφ) | ROM ADDRESS | VALUE D0 (SU) OF sin(Δφ) ROM | VALUE D1 (SD) OF sin(Δφ) ROM |
|---|---|---|---|---|---|---|---|
| 0 | 0 | 0 | 0 | UNDEFINED | 0 | X | X |
| 0 | 0 | 0 | 1 | + | 1 | 1 | 0 |
| 0 | 0 | 1 | 0 | + | 2 | 1 | 0 |
| 0 | 0 | 1 | 1 | UNDEFINED | 3 | X | X |
| 0 | 1 | 0 | 0 | − | 4 | 0 | 1 |
| 0 | 1 | 0 | 1 | UNDEFINED | 5 | X | X |
| 0 | 1 | 1 | 0 | UNDEFINED | 6 | X | X |
| 0 | 1 | 1 | 1 | − | 7 | 0 | 1 |
| 1 | 0 | 0 | 0 | − | 8 | 0 | 1 |
| 1 | 0 | 0 | 1 | UNDEFINED | 9 | X | X |
| 1 | 0 | 1 | 0 | UNDEFINED | 10 | X | X |
| 1 | 0 | 1 | 1 | − | 11 | 0 | 1 |
| 1 | 1 | 0 | 0 | UNDEFINED | 12 | X | X |
| 1 | 1 | 0 | 1 | + | 13 | 1 | 0 |
| 1 | 1 | 1 | 0 | + | 14 | 1 | 0 |
| 1 | 1 | 1 | 1 | UNDEFINED | 15 | X | X |

FIG. 8

INPUT AND OUTPUT OF INTEGRATOR

| INPUT | | OUTPUT (CONTROL VOLTAGE) |
|---|---|---|
| SU | SD | |
| 1 | 0 | INCREASE |
| 0 | 1 | DECREASE |
| X | X | HOLD |

PHASE CORRECTOR AND PHASE CORRECTION METHOD

CROSS-REFERENCE TO RELATED APPLICATION

This application is based upon and claims the benefit of priority of the prior Japanese Patent Application No. 2009-144325, filed on Jun. 17, 2009, the entire contents of which are incorporated herein by reference.

FIELD

Embodiments of the present invention relate to a phase correction technology used for a wireless transmitter.

BACKGROUND

There is generally a limit to linearity of output signals of a power amplifier for radio, transmission, and particularly a gain decreases when the level of an input signal is large (linearity distortion). As a circuit for compensating for such a linearity distortion, a Cartesian feedback distortion compensating device is known. If a Cartesian feedback distortion compensating device ideally functions, high linearity of output signals of a power amplifier is obtained.

In a Cartesian feedback distortion compensating device, output signals of a power amplifier are taken out and are fed back to the input side. At this point, a phase shift in a feedback system occurs by the influence of, for example, antenna loads, a propagation delay between a directional coupler and a demodulator, or the like. Therefore, in order for a Cartesian feedback distortion compensating device to effectively operate, a phase shift in the feedback system needs to be corrected.

From such a viewpoint, a phase corrector to be applied to a Cartesian feedback distortion compensating device is known. FIG. 1 illustrates the main parts of the phase corrector.

With reference to FIG. 1, an in-phase component I and a quadrature component Q of a transmission base band signal are modulated by a quadrature modulator 40 and then are combined with each other. The resultant composite signal is amplified to a desired level by a power amplifier (PA) 90 and is transmitted as an RF signal (RF_OUT). Part of the RF signal (RF_OUT) is taken out (fed back) by a directional coupler. From the fed back signal y(t), a base band signal (in-phase component I*, quadrature component Q*) is generated by a quadrature demodulator 30. Here, I≠I* and Q≠Q* result from the above-described phase shift (in FIG. 1, a delay corresponding to the phase shift is denoted as a delay time "τ") of the feedback system, and therefore a phase corrector for correcting the phase shift is provided.

With reference to FIG. 1, a phase corrector includes a phase detector having a sine detecting unit 101 and a cosine detecting unit 102, and a phase shifter 104. Given that a target phase correction amount (i.e., phase error) is $\Delta\phi$, the fed back base band signal (in-phase component I*, quadrature component Q*) is expressed as the following equations (1) and (2). In equations (1) and (2), I=I* and Q=Q* hold merely for $\Delta\phi=0$. Sin ($\Delta\phi$) is calculated in the sine detecting unit 101, according to the following equation (3), where k is a normalization constant and $k=1/(I \cdot I + Q \cdot Q)$.

$$I^* = I \cdot \cos(\Delta\phi) + Q \cdot \sin(-\Delta\phi) \tag{1}$$

$$Q^* = I \cdot \sin(\Delta\phi) + Q \cdot \cos(\Delta\phi) \tag{2}$$

$$\sin(\Delta\phi) = k \cdot (I \cdot Q^* - Q \cdot I^*) \tag{3}$$

The cosine detecting unit 102 calculates cos ($\Delta\phi$) in accordance with the relationship: $\cos(\Delta\phi) = (1 - \sin^2(\Delta\phi))^{1/2}$. The cosine detecting unit 102 is configured such that the sum of squares of an input to the phase shifter 104 is a given constant Mag. This compensates for the error so as to keep constant the amplitude of an output signal of the phase shifter 104.

In the phase shifter 104, a carrier signal Sin(ωt) from a local oscillator and a signal obtained by shifting the phase of the carrier signal by π/2 are multiplied by sin($\Delta\phi$) and cos ($\Delta\phi$), respectively, and they are combined, as represented by the following equation (4). As a result, a signal sin(ωt+$\Delta\phi$) whose phase leads the phase of the carrier signal sin(ωt) from the local oscillator just by $\Delta\phi$ is supplied to the quadrature modulator 40. Therefore, the phase error between the RF signal y(t) fed back from the output of the radio transmitter and the carrier signal provided to the quadrature modulator 40 becomes 0 ($\Delta\phi=0$).

$$\cos(\Delta\phi) \cdot \sin(\omega \cdot t) + \sin(\Delta\phi) \cdot \cos(\omega \cdot t) = \sin(\omega t + \Delta\phi) \tag{4}$$

In a Cartesian feedback distortion compensating device illustrated in FIG. 1, the stability of the feedback control system depends on a loop transfer function. Here, the loop transfer function of the system varies according to the phase error $\Delta\phi$. Therefore, the stability of the system may be damaged depending on the value of the phase error $\Delta\phi$. At worst, the damaged stability will cause a transmission base band signal to oscillate.

Further description of the above issue is given as follows.

Given that an input (input base band signal) to the system is X(s), and the loop transfer function of the Cartesian feedback system is L(s, $\Delta\phi$), an error signal e(s) due to feedback (an error between a negative input base band signal and a fed back base band signal) is expressed by the following equation (5), where s is a Laplace operator.

$$e(s) = \frac{X(s)}{1 + L(s, \Delta\phi)} \tag{5}$$

As is apparent from equation (5), this system becomes unstable as the loop transfer function L(s, $\Delta\phi$) approaches −1. In other words, even when the system is designed as an ideal feedback system with no phase error $\Delta\phi$, a phase error $\Delta\phi$ actually exists. In the case where the phase error $\Delta\phi$ is very large at an early stage of the system at which phase correction has not yet been performed, and the like, the system sometimes becomes unstable. If the system becomes unstable, an error signal due to feedback will oscillate at worst as mentioned above. Once the oscillation of the error signal occurs, it becomes difficult for the feedback system to function properly.

SUMMARY

According to an aspect of the embodiments discussed herein, a phase corrector in a radio transmitter which converts a first signal into a radio signal and amplifies the radio signal by a power amplifier, the phase corrector includes a quadrature modulator which modulates a first carrier signal by using an in-phase component and a quadrature component of the first signal, a quadrature demodulator which demodulates a feedback signal fed back from output of the power amplifier by using a second carrier signal to generate a second signal including an in-phase component and a quadrature component, a phase detector which detects a phase error between the first signal and the second signal based on the in-phase components and the quadrature components of the first signal and the second signal, and a phase shifter which performs phase shift of any one of the first signal, the second signal, the first carrier signal and the second carrier signal based on a sum value obtained by adding to the phase error a first phase amount varying on a time base in a given phase range.

It is to be understood that both the foregoing general description and the following detailed description are exemplary and explanatory and are not restrictive of the embodiments, as claimed.

BRIEF DESCRIPTION OF DRAWINGS

FIG. 5 is a table illustrating a relationship between the signs of signal components of a transmission base band signal and a fed back base band signal and the sign of a sine value of a phase error in a second embodiment;

FIG. 7 is a table illustrating a setting example of a read only memory (ROM) in the phase detector in the second embodiment; and FIG. 8 is a table illustrating an input and output relationship of an integrator in the phase detector in the second embodiment.

DESCRIPTION OF EMBODIMENTS

First Embodiment

A radio transmitter including a Cartesian feedback distortion compensating device for compensating for a linearity distortion of a power amplifier will be described below. A phase corrector is applied to the Cartesian feedback distortion compensating device.

(1-1) Overall Configuration of Radio Transmitter

The overall configuration of a radio transmitter of a first embodiment is described with reference to FIG. 2.

Figure 1:
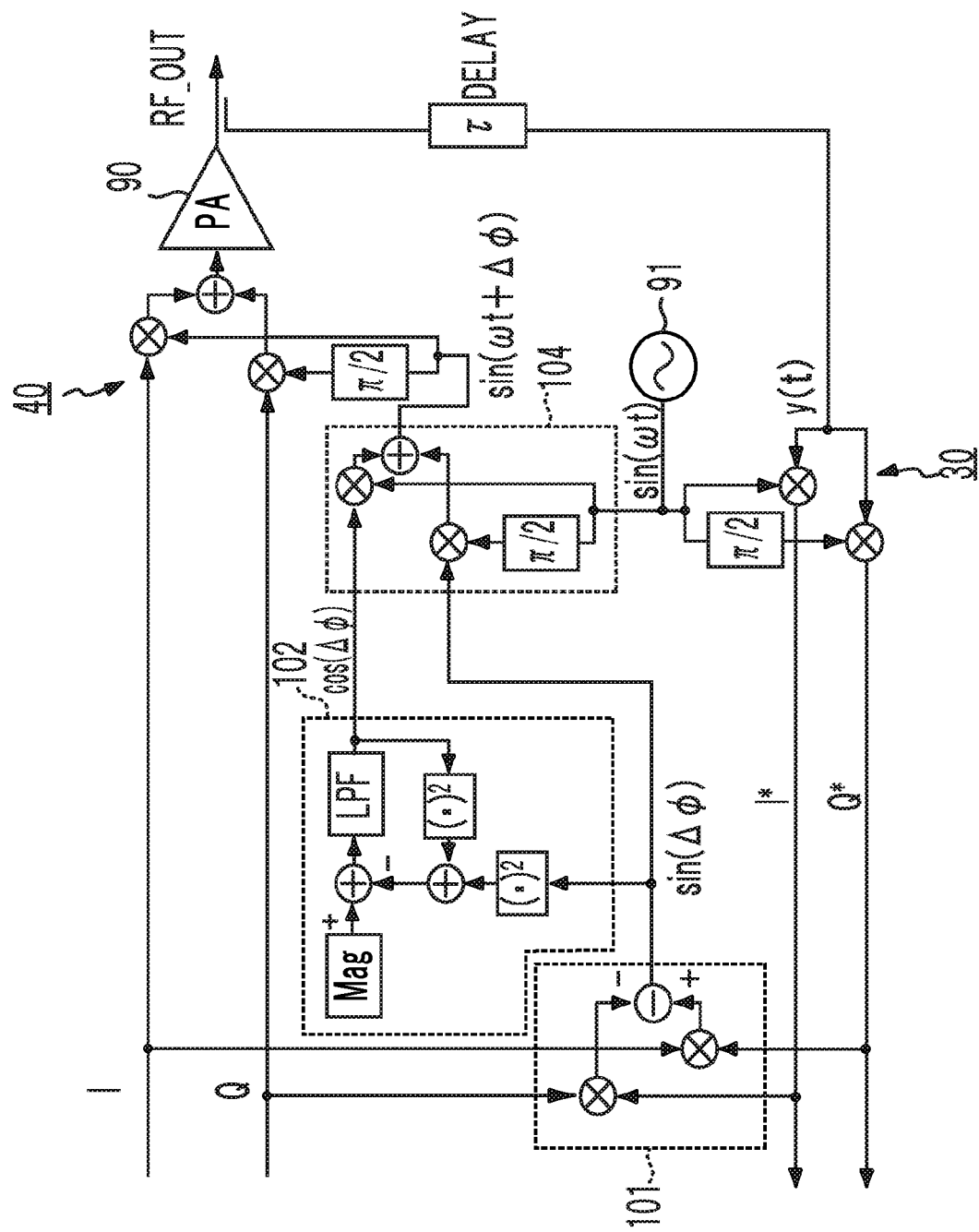
FIG. 1 is a block diagram illustrating an example of a related phase corrector.
Figure 2:
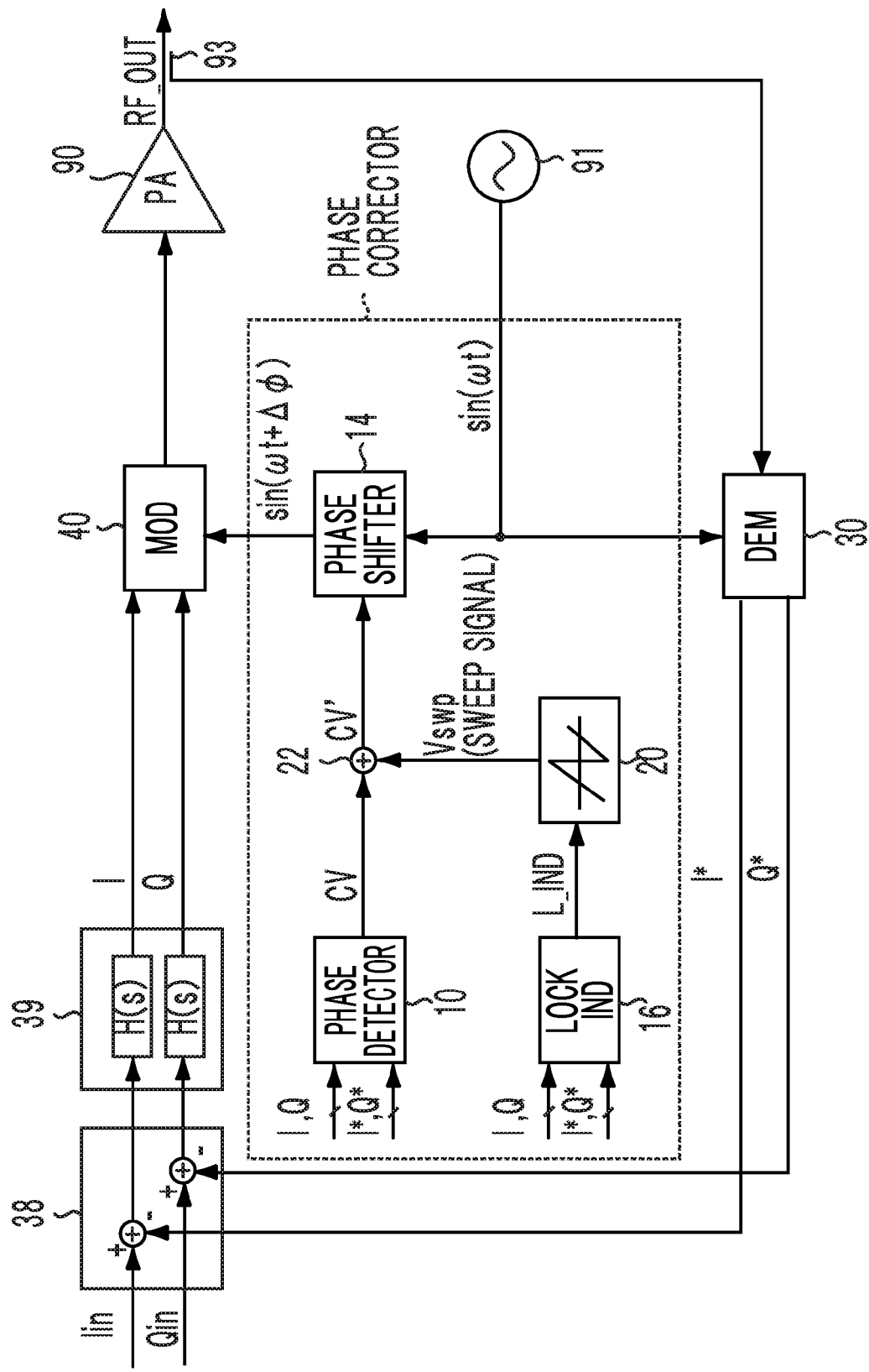
FIG. 2 is a block diagram illustrating an overall configuration of the main parts of a radio transmitter in a first embodiment.

FIG. 2 is a block diagram illustrating an overall configuration of the main parts of the radio transmitter of the first embodiment. The radio transmitter illustrated in FIG. 2 includes a phase detector 10, a phase shifter 14, a lock indicator (LOCK IND) 16, a signal generator 20, an adder 22, a quadrature demodulator (DEM) 30, a subtractor 38, a transfer element 39, a quadrature modulator (MOD) 40, a power amplifier (PA) 90, a local oscillator 91 and a directional coupler 93.

In the radio transmitter illustrated in FIG. 2, a carrier signal generated in the local oscillator 91 is provided to the quadrature demodulator 30. An RF signal (RF_OUT) output from the power amplifier 90 is taken out by the directional coupler 93, and a base band signal (in-phase component I*, quadrature component Q*) is generated by the quadrature demodulator 30. The base band signal (in-phase component I*, quadrature component Q*) is fed back to the subtractor 38. In the subtractor 38, the fed back base band signal (in-phase component I*, quadrature component Q*) is subtracted from an input base band signal (in-phase component $I_{in}$, quadrature component $Q_{in}$). An error signal obtained in the subtractor 38 is directed to the quadrature modulator 40. A Cartesian feedback system is thereby formed.

In this embodiment, the base band signal input to the quadrature modulator 40 is referred to as a "transmission base band signal (in-phase component I, quadrature component Q)". The transmission base band signal is a signal obtained by passing an error signal provided in the subtractor 38 through the transfer element 39 for amplification. The transmission base band signal (in-phase component I, quadrature component Q) and the fed back base band signal (in-phase component I*, quadrature component Q*) are input to the phase detector 10 and the lock indicator 16.

The phase detector 10 detects a phase error based on the transmission base band signal (in-phase component I, quadrature component Q) and the fed back base band signal (in-phase component I*, quadrature component Q*), and outputs a control signal (control voltage CV) corresponding to the detected phase error.

The signal generator 20 generates a sweep signal (variable voltage $V_{SWP}$) of a voltage corresponding to a phase error in the whole range from 0 to $2\pi$. The control signal from the phase detector 10 and the sweep signal from the signal generator 20 are added together in the adder 22, and the result is provided as a target correction amount (control voltage CV') to the phase shifter 14. The phase shifter 14 shifts the phase of a carrier signal for the quadrature modulator 40 which is provided from the local oscillator 91, by the target correction amount provided from the adder 22.

The phase corrector may be regarded as a phase locked loop (PLL) in that it synchronizes the phase of a transmission base band signal (in-phase component I, quadrature component Q) as an input signal with the phase of a base band signal (in-phase component I*, quadrature component Q*) as an output signal. In the description below, the phase corrector of the first embodiment is abbreviated simply as "PLL" as appropriate in the case where attention is given to the phase synchronizing function.

The lock indicator 16, as a correction determining unit, determines whether the PLL is locked or not and outputs a logic level lock determination signal L_IND to the signal generator 20. If the PLL is not locked, that is, a phase error is not corrected, the lock indicator 16 activates the lock determination signal L_IND to be output to the signal generator 20. As will be described later, the signal generator 20 controls an output signal based on the lock determination signal L_IND.

(1-2) Configuration of Phase Corrector

Next, the configuration of the phase corrector is described with reference to FIG. 3.

Figure 3:
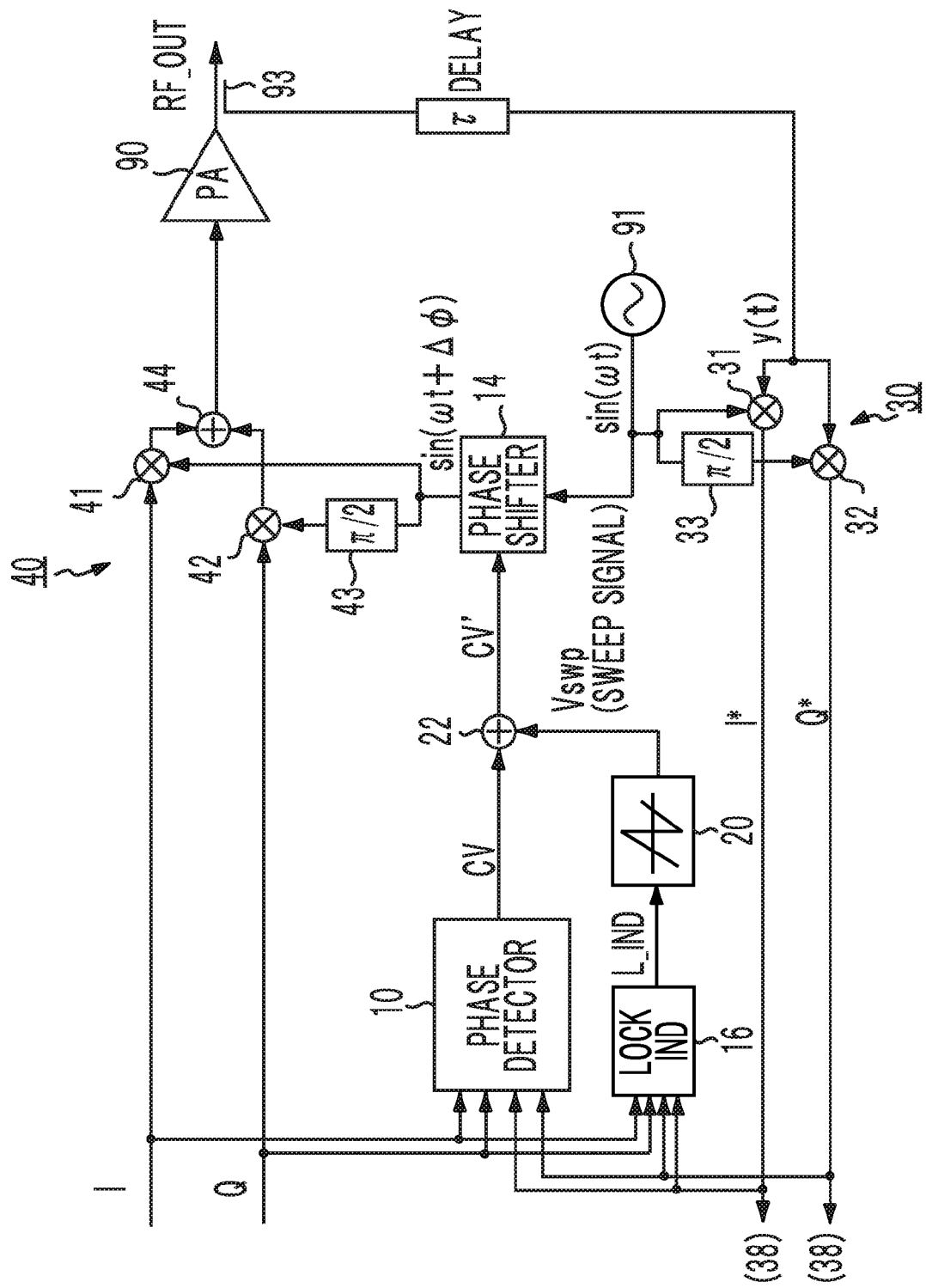
FIG. 3 is a block diagram illustrating only portions related to a phase corrector in the radio transmitter in the first embodiment.

FIG. 3 is a block diagram illustrating only portions related to the phase corrector in the radio transmitter of the first embodiment. In other words, unlike FIG. 2, FIG. 3 does not illustrate the whole Cartesian feedback system.

In FIG. 3, a delay element of an RF signal which is taken out from the directional coupler 93 and fed back is represented as "τ". As illustrated in FIG. 3, the quadrature demodulator 30 includes a mixer 31, a mixer 32 and a $\pi/2$ phase shifter 33, and the quadrature modulator 40 includes a mixer 41, a mixer 42, a $\pi/2$ phase shifter 43 and an adder 44.

The mixer 31 multiplies the fed back RF signal y(t) (feedback signal) by a carrier signal $\sin(\omega t)$ (second carrier signal) from the local oscillator 91 to generate the in-phase component I* of a base band signal (second signal). The mixer 32 multiplies the fed back RF signal y(t) by a signal obtained by shifting the carrier signal $\sin(\omega t)$ (second carrier signal) from the local oscillator 91 by π/2 to generate the quadrature component Q* of the base band signal (second signal).

A carrier signal (first carrier signal) provided to the quadrature modulator 40 is shifted by Δφ by the phase shifter 14 (sin(ωt+Δφ)). The mixer 41 multiplies the in-phase component I of the transmission base band signal (first signal) or the in-phase component I whose phase is shifted by the π/2 phase shifter 18, by the carrier signal sin(ωt+Δφ). The mixer 42 multiplies the quadrature component Q of the transmission base band signal (first signal) or the quadrature component Q whose phase is shifted by the π/2 phase shifter 18, by a signal obtained by shifting the phase of the carrier signal sin(ωt+Δφ) by π/2. The adder 44 adds output signals of the mixers 41 and 42 and supplies the sum to the power amplifier 90.

The phase detector 10 sets a controlled signal (control voltage CV) based on signals of components of the transmission base band signal (n-phase component I, quadrature component Q) and the fed back base band signal (n-phase component I*, quadrature component Q*). The control voltage CV as used herein is assumed to have a value in accordance with sin(Δφ) when the phase error between the transmission base band signal and the fed back base band signal is 4. The control voltage CV in accordance with the sin(Δφ) is obtained based on, for example, the above-mentioned equation (3).

By comparing the transmission base band signal (in-phase component I, quadrature component Q) with the fed back base band signal (second signal; in-phase component I*, quadrature component Q*), the lock indicator 16 determines whether or not a phase corrector, such as a PLL, performs locking. The configuration in the lock indicator 16 for determination of locking is not limited.

The lock indicator 16 may be configured, for example, as follows. When attention is paid, for example, just to an in-phase component, a normal value range (upper and lower limit reference voltages) of a difference value between I and I* is set in advance in the lock indicator 16. The lock indicator 16 sequentially calculates a difference value (voltage value) between I and I*, and compares the difference value with the upper and lower limit reference voltages using two comparators. Based on outputs (logic level) of two comparators, it is determined that the PLL is locked if the difference value does not exceed the normal value range, whereas it is determined that the PLL is not locked if the difference value exceeds the normal value range. The same way applies to the quadrature component.

As described above, the lock indicator 16 outputs to the signal generator 20 the lock determination signal L_IND indicating whether or not the PLL is locked.

When the phase corrector is regarded as the PLL, the loop filter of the PLL corresponds to filter characteristics of the phase detector 10. Accordingly, the difference value between I and I* and the difference value between Q and Q* calculated in the lock indicator 16 preferably take into account the filter characteristics of the phase detector 10.

The signal generator 20 generates a sweep signal when the lock determination signal L_IND indicating that the PLL is not locked is provided from the lock indicator 16. The sweep signal (variable voltage $V_{SWP}$) has a voltage whose magnitude is on the same order as the control voltage CV generated in the phase detector 10 (voltage on the same scale for the phase error as that of the control voltage CV), and its peak-to-peak (p-p) voltage corresponds to the whole phase range. For example, if the control voltage CV of the phase detector 10 can be $-a \leq CV \leq +a$ according to sin(Δφ) of the phase error Δφ, the voltage $V_{SWP}$ of a sweep signal can be $-a \leq V_{SWP} \leq +a$.

The range of the voltage $V_{SWP}$ corresponds to the range of the control voltage CV in the whole phase range ($-\pi \leq \Delta\phi \leq +\pi$) of the phase error Δφ.

It is preferable that the voltage change of a sweep signal be relatively slow. Specifically, the voltage change speed of the sweep signal is preferably determined such that the frequency of the voltage change is lower than a cut-off frequency in a frequency characteristic (gain characteristic) of the PLL.

The waveform of a sweep signal generated in the signal generator 20 is preferably a sawtooth waveform, but is not limited thereto. The waveform may be that which allows the whole desired range of a p-p voltage on the time base to be scanned. For example, a signal having a non-linear waveform, such as a sine wave, is acceptable.

A control signal (control voltage CV) from the phase detector 10 and a sweep signal (variable voltage $V_{SWP}$) from the signal generator 20 are added together in the adder 22, and a new control signal (control voltage CV') is output to the phase shifter 14. That is, the following equation (6) holds.

$$CV'=CV+V_{SWP} \quad (6)$$

The phase shifter 14 is a phase shifter for performing a phase shift whose amount corresponds to that of the control voltage CV' from the adder 22.

The phase shifter 14 shifts the phase of a carrier signal sin(ωt) from the local oscillator 91 by a shift amount based on the control voltage CV' from the adder 22 to produce a carrier signal sin(ωt+Δφ) of the quadrature modulator 40. In the first embodiment, the phase shifter 14 may shift a phase in accordance with the value of a provided control voltage, and its configuration is not limited.

(1-5) Operation of Phase Correction

Next, referring mainly to FIG. 3, the operation of phase correction in a radio transmitter of the first embodiment is described.

With reference to FIG. 3, in a radio transmitter of the first embodiment, after a transmission base band signal (in-phase component I, quadrature component Q) is modulated by the quadrature modulator 40, the transmission base band signal is amplified to a desired level by the power amplifier 90 and radiates out into open space. Here, in order to compensate for a linearity distortion in the power amplifier 90, the output signal RF_OUT of the power amplifier 90 is taken out by the directional coupler 93 and is fed back as the RF signal y(t) (Cartesian feedback). The signal fed back to the quadrature demodulator 30 is delayed by a delay element of the feedback system compared to, for example, an output signal of the quadrature modulator 40. Therefore, there may be a phase error between a transmission base band signal (in-phase component I, quadrature component Q) and a base band signal (in-phase component I*, quadrature component Q*) obtained by the quadrature demodulator 30. To correct the phase error, signals of the components are input to the phase detector 10. The signals of the components of the transmission base band signal (in-phase component I, quadrature component Q) and the fed back base band signal (in-phase component I*, quadrature component Q*) are also input to the lock indicator 16.

Based upon the signals of the components of the input transmission base band signal (in-phase component I, quadrature component Q) and the fed back base band signal (in-phase component I*, quadrature component Q*), the phase detector 10 sets the control voltage CV to be provided to the phase shifter 14. The control voltage CV has a value corresponding, for example, to sin(Δφ), where a phase error between the transmission base band signal and the fed back base band signal is Δφ. In the adder 22, the control voltage CV' obtained by adding the control voltage CV from the phase detector 10 and the voltage $V_{SWP}$ of a sweep signal, for example, having a sawtooth wave shape, from the signal generator 20 is provided to the phase shifter 14.

For a carrier signal $\sin(\omega t)$ from the local oscillator 91, the phase shifter 14 shifts the phase according to the magnitude of the control voltage CV' from the adder 22 to produce a carrier signal $\sin(\omega t+\Delta\phi)$ for the quadrature modulator 40. At this point, in cases where the phase error $\Delta\phi$ is in a small range, such as $-\pi/2<\Delta\phi<+\pi/2$, it is possible for the phase shifter 14 alone to correct the phase. In cases where the phase error $\Delta\phi$ is large, however, it is sometimes not possible for the phase shifter 14 to correct the phase, depending on the configuration of the phase detector 10 and/or the phase shifter 14.

In this phase corrector, the lock indicator 16 always determines whether the PLL included in the system is locked, based on a transmission base band signal and a fed back base band signal. As long as the lock determination signal L_IND indicating that the PLL is not locked is provided to the signal generator 20, the signal generator 20 outputs a sweep signal to the adder 22. Since the range of the variable voltage $V_{SWP}$ (first phase amount) of the sweep signal corresponds to the whole phase range (0 to $2\pi$) of a phase error, the control voltage CV' provided from the adder 22 to the phase shifter 14 may also vary in a voltage range corresponding to the whole phase range (0 to $2\pi$) of the phase error. Therefore, the PLL is locked at a certain time point as the voltage of the sweep signal varies. Once the PLL is locked, then the phase error is settled in the lock range to cause the operation of a phase correction process to be stable. When a phase error enters the lock range, the lock indicator 16 determines that the PLL is locked, and transmits to the signal generator 20 the lock determination signal L_IND indicating that the PLL is locked. Upon receiving the lock determination signal L_IND, the signal generator 20 no longer needs to output a sweep signal, and therefore fixes the output voltage to the voltage value (second phase amount) of a sweep signal at that time.

In the case of receiving the lock determination signal L_IND indicating that the PLL is locked, the signal generator 20 may continue outputting a sweep signal instead of outputting a fixed voltage value (second phase amount). As long as the speed of the voltage change of a sweep signal is sufficiently slow as to allow the PLL to follow the voltage change, no particular problems are incurred if outputting a sweep signal is continued.

As described above, a phase corrector of the first embodiment adds to a phase error detected by the phase detector 10 a phase amount which results from sweeping in the whole estimated range of the phase error so as to determine a target value for phase correction. This enables entering the lock range of the PLL to be quickly performed at an early stage of the phase correction process. Accordingly, even if the phase error $\Delta\phi$ in its initial state is large, phase correction is quickly performed. This enables removal, at an early stage, of a factor which causes a Cartesian feedback system to become unstable because of a large phase error $\Delta\phi$.

Figure 4:
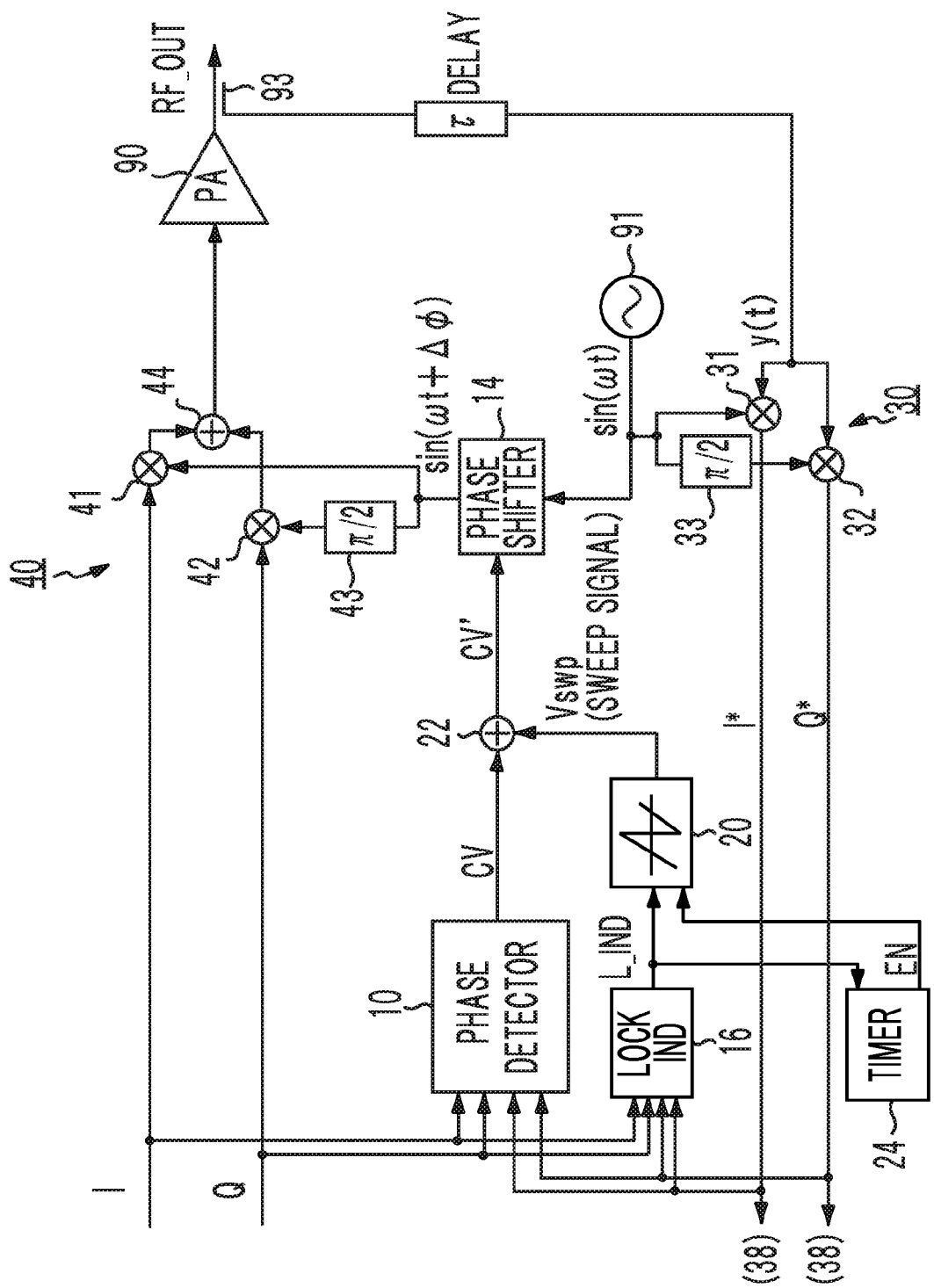
FIG. 4 is a block diagram illustrating a phase corrector of the first embodiment in which a timer is added.

A timer for limiting the operation period of a sweep signal may be provided in order to suppress power consumption of the signal generator 20. A phase corrector including a timer is illustrated in FIG. 4. The phase corrector illustrated in FIG. 4 includes a timer 24 for limiting the operation period of a sweep signal. The timer 24 is configured to start timer counting upon receiving from the lock indicator 16 the lock determination signal L_IND indicating that the PLL is not locked and to stop the timer counting when a given operation period has passed. When the timer counting stops, the logic level of an enable signal EN supplied from the timer 24 to the signal generator 20 varies. According to the variance of the logic level, the signal generator 20 stops outputting of a sweep signal.

The operation period set by a timer is preferably set to a period in which a voltage in the range corresponding to the whole phase range (0 to $2\pi$) is swept several times. This sufficiently ensures a period which allows a PLL to be locked during the operation period of a sweep signal.

Second Embodiment

A radio transmitter including another embodiment of a phase corrector is described below. Here, another configuration example of the phase detector 10 in the first embodiment is described.

(2-1) Digital Processing of Phase Detection

In a phase corrector of a second embodiment, the phase detector 10 performs phase detection by means of digital processing. The method of the digital processing is described with reference to FIG. 5.

FIG. 5 is a table illustrating a relationship between signs of signals of components of the transmission base band signal (in-phase component I, quadrature component Q) and components of the fed back base band signal (in-phase component I*, quadrature component Q*) and the sign of $\sin(\Delta\phi)$ ($\Delta\phi$: phase error). The relationship between both signs is obtained by the foregoing equation (3). Note that "undefined" of the sign of $\sin(\Delta\phi)$ in FIG. 5 represents that the sign of $\sin(\Delta\phi)$ is not defined just by signs of I, Q, I* and Q*. For example, if I, Q, I* and Q* are all negative (−), there is a possibility that the term (I·Q*−Q·I*) in the foregoing equation (3) is either positive (+) or negative (−). In this case, the expression "undefined" is used as the sign of $\sin(\Delta\phi)$.

As illustrated in FIG. 5, the phase detector 10 sequentially detects the signs of the components I, Q, I* and Q*. The phase detector 10 increases the control voltage CV by a given amount if the sign of $\sin(\Delta\phi)$ is positive (±). The phase detector 10 decreases the control voltage CV by a given amount if the sign of $\sin(\Delta\phi)$ is negative (−). The phase detector 10 holds the control voltage CV if the sign of $\sin(\Delta\phi)$ is "undefined".

(2-2) Specific Configuration Example of Phase Detector 10

Figure 6:
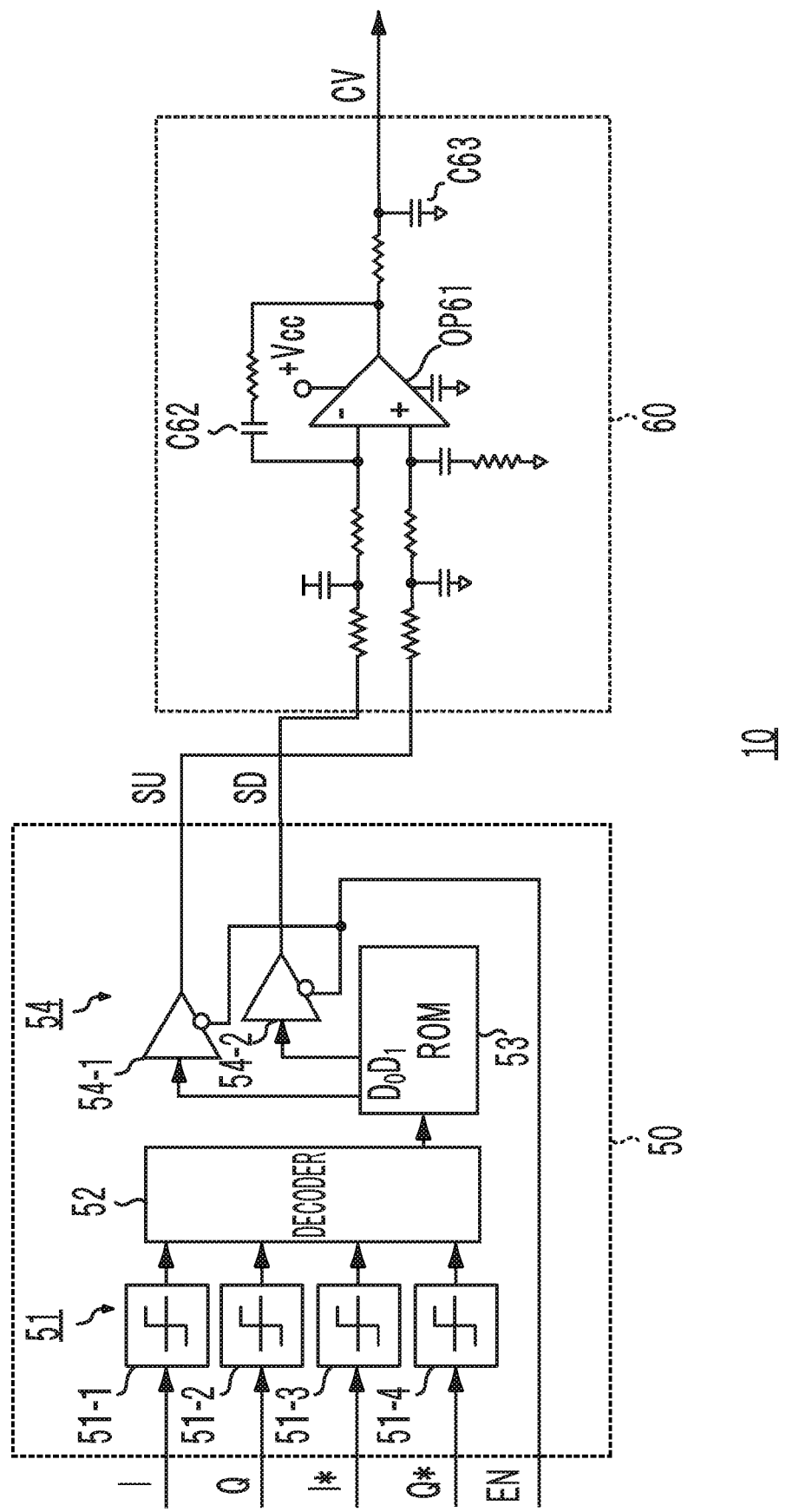
FIG. 6 is a block diagram illustrating a specific configuration example of a phase detector in the second embodiment.

Next, a specific configuration example of the phase detector 10 is described with reference to FIGS. 6 to 8. FIG. 6 is a block diagram illustrating a specific configuration example of the phase detector 10. FIG. 7 is a table illustrating a setting example of a ROM in the phase detector 10 illustrated in FIG. 6. FIG. 8 is a table illustrating an input and output relationship of an integrator in the phase detector 10.

The phase detector 10 illustrated in FIG. 6 includes a digital processor 50 and an integrator 60. The digital processor 50 includes a group of comparators 51 (comparators 51-1 to 51-4), a decoder 52, a ROM 53 as a first memory, and a group of buffers (buffers 54-1 and 54-2). The integrator 60 includes an operational amplifier OP61, resistance elements and capacitors (capacitors C62, C63 and the like) connected to input terminals and an output terminal of the operational amplifier OP61.

In the digital processor 50, each of the group of comparators 51 digitizes an input signal.

In other words, the comparator 51-1 compares the signal level (e.g., voltage amplitude level) of the in-phase component I of a transmission base band signal with a given threshold. If the signal level of the component I is larger than the threshold, the comparator 51-1 outputs "1" as the logic level, whereas, if the signal level is equal to or less than the threshold, the comparator 51-1 outputs "0" as the logic level. The comparator 51-2 compares the signal level of the quadrature component Q of the transmission base band signal with a given threshold. If the signal level of the component Q is larger than the threshold, the comparator 51-2 outputs "1" as the logic level, whereas, if the signal level is equal to or less than the threshold, the comparator 51-2 outputs "0" as the logic level. The comparator 51-3 compares the signal level of the in-phase component I* of a fed back base band signal with a given threshold. If the signal level of the component I* is larger than the threshold, the comparator 51-3 outputs "1" as the logic level, whereas, if the signal level is equal to or less than the threshold, the comparator 51-3 outputs "0" as the logic level. The comparator 51-4 compares the signal level of the quadrature component Q* of the fed back base band signal with a given threshold. If the signal level of the component Q* is larger than the threshold, the comparator 51-4 outputs "1" as the logic level, whereas, if the signal level is equal to or less than the threshold, the comparator 51-4 outputs "0" as the logic level.

The threshold in each comparator is preferably zero. When the threshold in each comparator is zero, the comparator outputs "1" (if an input signal is positive (+)) or "0" (if the input signal is negative) in accordance with the sign of the input signal. In this case, a relationship between the output of the comparator and the sign of $\sin(\Delta\phi)$ illustrated in FIG. 7 is equivalent to that illustrated in FIG. 5.

However, the threshold in each comparator is not limited to zero, and may be another value with consideration given to the offset amount of a base band signal. In this case, it is possible to regard the "sign" of each component illustrated in FIG. 5 as a relative magnitude relationship with a given threshold, which is not limited to zero, used as a criterion. Even a value other than zero may be set as the threshold as long as the value allows determination as to whether $\sin(\Delta\phi)$ is to be changed, that is, whether the control voltage CV is to be increased or decreased.

The decoder 52 converts outputs (4-bit parallel signals) of the comparators 51-1 to 51-4 into addresses of the ROM 53. With reference to FIG. 7, combinations of outputs ("0" or "1") of comparators and ROM addresses are defined. In the decoder 52, the ROM addresses are set in accordance with this relationship.

In the ROM 53, 2-bit data $D_0$ and $D_1$ is stored at every ROM address. The 2-bit data $D_0$ and $D_1$ (logic level) in accordance with the ROM address set by the decoder 52 is output from the ROM 53.

The data of the ROM 53 is set according to the following criteria. That is, as illustrated in FIG. 7, it is determined that the control voltage CV ($\sin(\Delta\phi)$) is increased by a given amount, decreased by a given amount, or held, in accordance with the output of each comparator. If the sign of $\sin(\Delta\phi)$ is positive (+), $D_0=1$ and $D_1=0$ are set as output data of the ROM 53. If the sign of $\sin(\Delta\phi)$ is negative (−), $D_0=0$ and $D_1=1$ are set as output data of the ROM 53. If the sign of $\sin(\Delta\phi)$ is undefined, $D_0=X$ and $D_1=X$ (both, high impedance) are set.

The buffers 54-1 and 54-2 are output buffers for outputting the data $D_0$ and $D_1$ of the ROM 53, respectively, to the integrator 60. Each buffer is controlled by an external enable signal EN to output data of the ROM 53 without being changed or place the output in a high impedance state. Each buffer outputs the data $D_0$ and $D_1$ without any changes as signals SU and SD to the integrator 60 when the enable signal EN is at a low level, whereas the buffer places the data $D_0$ and $D_1$, that is, the signals SU and SD in a high-impedance state when the enable signal EN is at a high level.

As illustrated in FIG. 6, in the integrator 60, a capacitor C62 is provided in a feedback loop connecting an output terminal with a reversed input terminal of the operational amplifier OP61. An integrating circuit is made up of the capacitor C62 and resistance elements connected to input terminals of the operational amplifier OP61. A capacitor C63 for holding the control voltage CV is connected through a resistance element to the output terminal of the operational amplifier OP61. The polarity of the result of integration is reversed to that of the input signal in the integrator 60, and therefore the signals SU and SD from the digital processor 50 are input to the non-reversed input terminal and the reversed input terminal of the operational amplifier OP61, respectively. When this phase corrector is applied to an actual system, the gain and frequency characteristics of the control voltage CV may be adjusted by resistance elements and capacitors in the integrator 60.

With reference to FIG. 8, the integrator 60 operates in accordance with input signals SU and SD, as follows. That is, in the integrator 60, when SU=1 ($D_0$=1) and SD=0 ($D_1$=0), the control voltage CV is increased by a given amount. In the integrator 60, when SU=0 ($D_0$=0) and SD=1 ($D_1$=1), the control voltage CV is decreased by a given amount. In the integrator 60, when an input is in a high impedance state ($D_0$=X and $D_1$=X), the control voltage CV is held.

The operation of the phase detector 10 in the second embodiment is as follows.

That is, the phase detector 10 first compares an input signal of each component (I, Q, I* or Q*) with a given threshold and digitizes the input signal in the digital processor 50. Given that a phase error is 4, data on whether $\sin(\Delta\phi)$ is to be increased, to be decreased, or to be held, which is based on combinations of digitized signals of components, is stored in advance in the ROM 53 in the digital processor 50 (see FIG. 7). In the digital processor 50, signals of components (I, Q, I* and Q*) are consecutively taken in, and 2-bit data ($D_0$ and $D_1$) is taken out from the corresponding ROM 53. The data of the ROM passes through buffers, and is supplied as signals at a given amplitude level (signals at the same level as the data of the ROM) to the integrator 60. In the integrator 60, based on the signals from the buffers, an output voltage (control voltage CV) for the phase shifter 14 is increased, decreased or held (consecutively updated). In this way, the control voltage CV in accordance with $\sin(\Delta\phi)$, where a phase error is $\Delta\phi$, is obtained. The control voltage CV is added to the voltage of a sweep signal, and the resultant voltage is input to the phase shifter 14.

A phase corrector and a phase correction method of the disclosed first and second embodiments improve stability of the phase correction operation.

While an example in which the phase detector 10 shifts the phase of a carrier signal (first carrier signal) to be provided to the quadrature modulator 40 is used in distortion compensating devices of the first and second embodiments, an object of phase shifting is not limited thereto. The object of phase shifting of the phase detector 10 may be a transmission base band signal, may be a fed back base band signal, and may be a carrier signal (second carrier signal) to be provided to the quadrature demodulator 30.

It will be understood that a specific circuit configuration referred to in the description of the second embodiment is merely exemplary and may be replaced by another circuit configuration with similar functions. For example, an integrator illustrated in FIG. 6 is merely exemplary, and the same functions may be implemented in a digital circuit. In this case, the digital circuit may include a counter which performs addition and subtraction in accordance with a signal level from the digital processor 50, a digital/analogue converter (DAC) and the like. An integrator illustrated in FIG. 6 is economical in that a DAC is unnecessary because addition and subtraction of signals (logic level voltage) output from a digital processor are performed at an analogue level.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to any illustration of the superiority and inferiority of the invention. Although the embodiments of the present invention have been described in detail, it should be understood that the various changes, substitutions, and alterations could be made hereto without departing from the spirit and scope of the invention.

What is claimed is:

1. A phase corrector in a radio transmitter which converts a first signal into a radio signal and amplifies the radio signal by a power amplifier, the phase corrector comprising:
    a quadrature modulator which modulates a first carrier signal by using an in-phase component and a quadrature component of the first signal;
    a quadrature demodulator which demodulates a feedback signal fed back from an output of the power amplifier by using a second carrier signal to generate a second signal including an in-phase component and a quadrature component;
    a phase detector which detects a phase error between the first signal and the second signal based on the in-phase components and the quadrature components of the first signal and the second signal; and
    a phase shifter which performs phase shift of any one of the first signal, the second signal, the first carrier signal and the second carrier signal based on a sum value obtained by adding to the phase error a first phase amount varying on a time base in a given phase range.

2. The phase corrector according to claim 1, further comprising:
    a correction determining unit which determines whether or not the phase error has been corrected, based on the in-phase components and the quadrature components of the first signal and the second signal,
    wherein the phase shifter performs phase shift based on the sum value when the correction determining unit determines that the phase error has not been corrected.

3. The phase corrector according to claim 2, wherein, after the correction determining unit performs determination that the phase error has been corrected, the target value of the phase shifter is obtained by adding to the phase error a second phase amount which is the first phase amount at a time point of the determination.

4. The phase corrector according to claim 2, wherein a period during which the first phase amount is added to the phase error, the period starting from a starting time or a time point at which the correction determining unit determines that the phase error has not been corrected, is limited to a given period.

5. The phase corrector according to claim 1, wherein the phase detector includes a first memory which stores information on whether a sine value of the phase error is to be increased, decreased or held, according to a combination of digitized signals of components of the first signal and the second signal, and consecutively updates the sine value of the phase error, referring to the first memory based on the components of the first signal and the second signal which are consecutively digitized.

6. A phase correction method in a radio transmitter which converts a first signal into a radio signal and amplifies the radio signal by a power amplifier, the phase correction method comprising:
    modulating a first carrier signal by using an in-phase component and a quadrature component of the first signal;
    demodulating a feedback signal fed back from an output of the power amplifier by using a second carrier signal to generate a second signal including an in-phase component and a quadrature component;
    detecting a phase error between the first signal and the second signal based on the in-phase components and the quadrature components of the first signal and the second signal; and
    performing phase shift of any one of the first signal, the second signal, the first carrier signal and the second carrier signal based on a sum value obtained by adding to the phase error a first phase amount varying on a time base in a given phase range.

7. The phase correction method according to claim 6, further comprising:
    determining whether or not the phase error has been corrected, based on the in-phase components and the quadrature components of the first signal and the second signal,
    wherein the performing includes performing phase shift based on the sum value when the determining determines that the phase error has not been corrected.

8. The phase correction method according to claim 7, wherein, after determination that the phase error has been corrected by the determining, the target value of the phase shifter is obtained by adding to the phase error a second phase amount which is the first phase amount at a time point of the determination.

9. The phase correction method according to claim 7, wherein a period during which the first phase amount is added to the phase error, the period starting from a starting time or a time point at which the determining determines that the phase error has not been corrected, is limited to a given period.

10. The phase correction method according to claim 6, wherein, the detecting includes updating a sine value of the phase error consecutively with reference to a first memory which stores information on whether the sine value of the phase error is to be increased, decreased or held, according to a combination of digitized signals of components of the first signal and the second signal.

* * * * *